(12) United States Patent
Ikegami

(10) Patent No.: US 11,777,534 B2
(45) Date of Patent: Oct. 3, 2023

(54) RADIO FREQUENCY MODULE AND COMMUNICATION DEVICE

(71) Applicant: Murata Manufacturing Co., Ltd., Kyoto (JP)

(72) Inventor: Katsuya Ikegami, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 256 days.

(21) Appl. No.: 17/396,909

(22) Filed: Aug. 9, 2021

(65) Prior Publication Data

US 2021/0367622 A1 Nov. 25, 2021

Related U.S. Application Data

(63) Continuation of application No. PCT/JP2020/024506, filed on Jun. 23, 2020.

(30) Foreign Application Priority Data

Jul. 3, 2019 (JP) .................................. 2019-124841

(51) Int. Cl.
*H04B 1/00* (2006.01)
*H03H 7/01* (2006.01)
*H05K 1/18* (2006.01)

(52) U.S. Cl.
CPC ........... *H04B 1/005* (2013.01); *H03H 7/0115* (2013.01); *H03H 7/1758* (2013.01);
(Continued)

(58) Field of Classification Search
CPC . H04B 1/005; H04B 1/00; H04B 1/40; H04B 1/006; H04B 1/10; H04B 1/0057;
(Continued)

(56) References Cited

U.S. PATENT DOCUMENTS

| 7,373,171 B2 * | 5/2008 | Nakai ..................... H04B 1/40 455/80 |
| 7,808,752 B2 * | 10/2010 | Richiuso .............. H03H 7/0115 361/111 |
| 7,885,613 B2 * | 2/2011 | Kemmochi .............. H04B 1/00 455/78 |
| 8,849,362 B1 * | 9/2014 | Saji .......................... H05K 1/18 257/659 |

(Continued)

FOREIGN PATENT DOCUMENTS

EP  2144377 A1 * 1/2010 ........... H04B 1/0057
JP  2006-304081 A  11/2006
(Continued)

OTHER PUBLICATIONS

International Search Report issued in Application No. PCT/JP2020/024506, dated Sep. 29, 2020.

*Primary Examiner* — Lana N Le
(74) *Attorney, Agent, or Firm* — Pearne & Gordon LLP

(57) ABSTRACT

A radio frequency module (1) includes a first switch (4), an attenuation filter (3), and a plurality of band pass filters (12A to 12C, 22A to 22C). The first switch (4) is a switch that is capable of simultaneously connecting a common terminal (40) to selection terminals (41, 42) out of a plurality of selection terminals (41 to 43). The plurality of band pass filters (12A to 12C, 22A to 22C) include a first band pass filter (22A) and a second band pass filter (22B). The attenuation filter (3) includes at least one reactive element out of an inductive element and a capacitive element. In the radio frequency module (1), the reactive element is adjacent to at least one band pass filter out of the plurality of band pass filters (12A to 12C, 22A to 22C).

20 Claims, 6 Drawing Sheets

(52) U.S. Cl.
CPC ............ *H03H 7/1766* (2013.01); *H05K 1/181* (2013.01); *H03H 2007/013* (2013.01); *H05K 2201/1006* (2013.01); *H05K 2201/10053* (2013.01)

(58) Field of Classification Search
CPC ...... H04B 1/1036; H04B 1/1027; H04B 1/04; H04B 1/0475; H04B 1/0053; H04B 1/48; H04B 1/525; H04B 1/401; H03H 7/0115; H03H 7/1758; H03H 7/1766; H03H 2007/013; H03H 2250/00; H03H 19/002; H03H 7/01; H03H 11/04; H03H 7/38; H05K 1/181; H05K 2201/10053; H05K 2201/1006; H05K 1/18; H05K 1/0216; H03K 17/693
See application file for complete search history.

(56) References Cited

U.S. PATENT DOCUMENTS

| | | | |
|---|---|---|---|
| 9,997,834 B1* | 6/2018 | Miura | ...................... H01Q 7/08 |
| 9,998,098 B2* | 6/2018 | Takata | ................. H03H 7/1766 |
| 2012/0208475 A1 | 8/2012 | Uejima | |
| 2014/0184357 A1* | 7/2014 | Jang | ..................... H03H 7/0115 333/185 |
| 2017/0048859 A1 | 2/2017 | Hayakawa | |

FOREIGN PATENT DOCUMENTS

| | | |
|---|---|---|
| JP | 2012-80160 A | 4/2012 |
| JP | 2012-169798 A | 9/2012 |
| JP | 2017-38352 A | 2/2017 |
| WO | 2018/110577 A1 | 6/2018 |

* cited by examiner

RADIO FREQUENCY MODULE AND COMMUNICATION DEVICE

CROSS REFERENCE TO RELATED APPLICATION

This is a continuation of International Application No. PCT/JP2020/024506 filed on Jun. 23, 2020 which claims priority from Japanese Patent Application No. JP 2019-124841 filed on Jul. 3, 2019. The contents of these applications are incorporated herein by reference in their entireties.

BACKGROUND OF THE DISCLOSURE

Field of the Disclosure

The present disclosure generally relates to a radio frequency module and a communication device and more specifically to a radio frequency module including a low pass filter or a notch filter and a communication device including the radio frequency module.

Description of the Related Art

Hitherto, a radio frequency module (a front end module) arranged in a front end unit of a multimode or multiband cellular phone is known (for example, see Patent Document 1).

The radio frequency module described in Patent Document 1 includes a low pass filter, a switch (a switch module), a first band pass filter, and a second band pass filter (a first duplexer and a second duplexer).

The low pass filter is connected between a common terminal of the switch and an antenna. The first band pass filter is connected to a first selection terminal of the switch. The second band pass filter is connected to a second selection terminal of the switch. The first band pass filter is a filter that allows a signal of a first frequency band to pass therethrough. The second band pass filter is a filter that allows a signal of a second frequency band located on the high frequency side with respect to the first frequency band to pass therethrough.

Patent Document 1: Japanese Unexamined Patent application Publication No. 2017-38352

BRIEF SUMMARY OF THE DISCLOSURE

As in the front end module described in Patent Document 1, suppose a case where a low pass filter is connected to a switch between an antenna and a switch managing a first band pass filter, which corresponds to relatively low frequencies, and a second band pass filter, which corresponds to relatively high frequencies, and carrier aggregation is performed using the first band pass filter and the second band pass filter. In this case, there is a problem in that the filter characteristic of the second band pass filter is degraded when a harmonic wave component of a signal of the first frequency band is within the pass band of the low pass filter and overlaps an attenuation region on the high frequency hide of the second band pass filter.

An object of the present disclosure is to provide a radio frequency module and a communication device that can suppress degradation of the filter characteristic of a band pass filter corresponding to relatively high frequencies due to a harmonic wave component of a signal that passes through a band pass filter corresponding to relatively low frequencies.

A radio frequency module according to an embodiment of the present disclosure includes a mounting board, a switch, an attenuation filter, and a plurality of band pass filters. The switch is mounted on the mounting board, has a common terminal, which is connected to an antenna terminal, and a plurality of selection terminals, which are to be connected to the common terminal, and is capable of simultaneously connecting the common terminal to at least a first selection terminal and a second selection terminal out of the plurality of selection terminals. The attenuation filter is mounted on the mounting board and is connected between the common terminal and the antenna terminal. The plurality of band pass filters are mounted on the mounting board and are connected to the plurality of selection terminals. The plurality of band pass filters have the first band pass filter and the second band pass filter. The first band pass filter is connected to the first selection terminal and has a pass band, which is a first frequency band. The second band pass filter is connected to the second selection terminal and has a pass band, which is a second frequency band, which is higher than the first frequency band. The attenuation filter is a low pass filter or a notch filter including at least one reactive element out of an inductive element and a capacitive element. In the radio frequency module, the reactive element is adjacent to at least one band pass filter out of the plurality of band pass filters in a case where the mounting board is viewed in a plan view.

A radio frequency module according to an embodiment of the present disclosure includes a mounting board, a switch, an attenuation filter, a plurality of band pass filters, and a plurality of inductors. The switch is mounted on the mounting board, has a common terminal, which is connected to an antenna terminal, and a plurality of selection terminals, which are to be connected to the common terminal, and is capable of simultaneously connecting the common terminal to at least a first selection terminal and a second selection terminal out of the plurality of selection terminals. The attenuation filter is mounted on the mounting board and is connected between the common terminal and the antenna terminal. The plurality of band pass filters are mounted on the mounting board and are connected to the plurality of selection terminals. The plurality of inductors are connected to the plurality of band pass filters between the plurality of band pass filters and the switch. The plurality of band pass filters have the first band pass filter and the second band pass filter. The first band pass filter is connected to the first selection terminal and has a pass band, which is a first frequency band. The second band pass filter is connected to the second selection terminal and has a pass band, which is a second frequency band, which is higher than the first frequency band. The attenuation filter is a low pass filter or a notch filter including at least one reactive element out of an inductive element and a capacitive element. In the radio frequency module, the reactive element is adjacent to at least one inductor out of the plurality of inductors in a case where the mounting board is viewed in a plan view.

A communication device according to an embodiment of the present disclosure includes the radio frequency module and a signal processing circuit. The signal processing circuit processes a reception signal received through the antenna terminal.

According to the radio frequency modules and communication device according to the above-described embodiments of the present disclosure, the degradation of the filter characteristic of a band pass filter corresponding to relatively high frequencies due to a harmonic wave component of a signal that passes through a band pass filter corresponding to relatively low frequencies can be suppressed.

DETAILED DESCRIPTION OF THE DISCLOSURE

Figure 1:
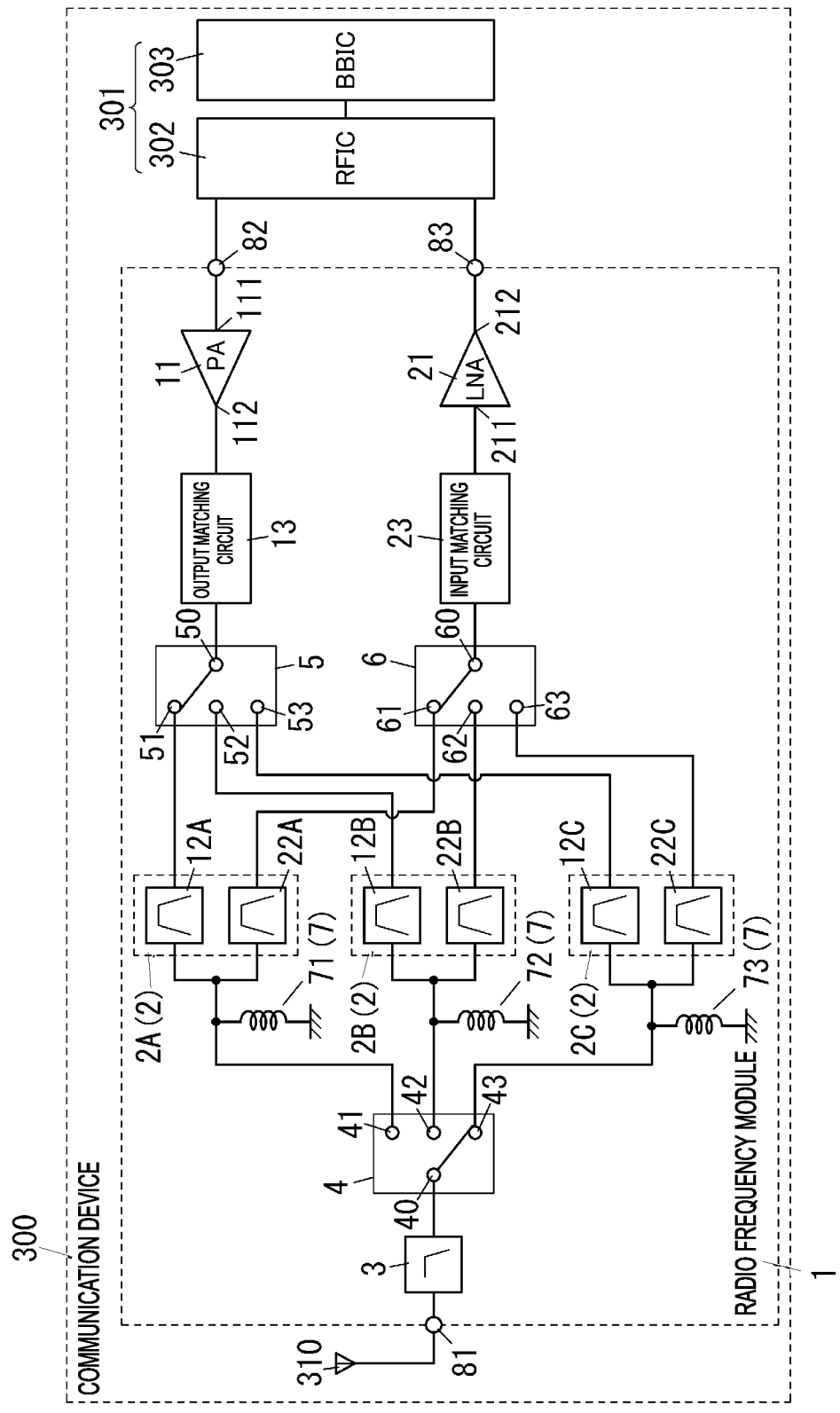
FIG. 1 is a circuit configuration diagram of a communication device including a radio frequency module according to a first embodiment.

Both of FIGS. 3 and 7, to which reference will be made in a first embodiment and so forth below, are schematic diagrams. The ratios between the sizes and thicknesses of the individual constituent elements in the drawings may not necessarily reflect the actual dimensional ratios.

First Embodiment

In the following, a radio frequency module 1 and a communication device 300 according to the first embodiment will be described with reference to FIGS. 1 to 4.

(1) Overall Configuration of Radio Frequency Module

The radio frequency module 1 according to the present embodiment is used in, for example, the communication device 300, which is a multimode or multiband communication device. The communication device 300 is, for example, a cellular phone (for example, a smartphone) but not limited to this and may be, for example, a wearable terminal (for example, a smartwatch) or the like. The radio frequency module 1 is a module that can accommodate, for example, the fourth generation mobile communication (4G) standards, the fifth generation mobile communication (5G) standards, and so forth. The 4G standards are, for example, the 3GPP Long Term Evolution (LTE) standards. The 5G standards are, for example, 5G New Radio (NR). The radio frequency module 1 is a module that can support carrier aggregation and dual connectivity.

The radio frequency module 1 is configured to, for example, amplify a transmission signal inputted from a signal processing circuit 301 and output the resulting signal to an antenna 310. In addition, the radio frequency module 1 is configured to amplify a reception signal inputted from the antenna 310 and output the resulting signal to the signal processing circuit 301. The signal processing circuit 301 is not a constituent element of the radio frequency module 1 but a constituent element of the communication device 300 including the radio frequency module 1. The radio frequency module 1 according to the first embodiment is controlled by, for example, the signal processing circuit 301 included in the communication device 300. The communication device 300 includes the radio frequency module 1 and the signal processing circuit 301. The communication device 300 further includes the antenna 310. The signal processing circuit 301 processes a reception signal received through the antenna 310.

The radio frequency module 1 according to the present embodiment includes a mounting board 9 (see FIG. 3), a switch 4, an attenuation filter 3, and a plurality of band pass filters (a first transmission filter 12A, a second transmission filter 12B, a third transmission filter 12C, a first reception filter 22A, a second reception filter 22B, and a third reception filter 22C). The attenuation filter 3 is, for example, a low pass filter.

The switch 4 is mounted on the mounting board 9 and has a common terminal 40, which is connected to an antenna terminal 81, and a plurality of selection terminals 41 to 43, which are to be connected to the common terminal 40. The switch 4 is a switch that can simultaneously connect the common terminal 40 to at least the selection terminal (a first selection terminal) 41 and the selection terminal (a second selection terminal) 42 out of the plurality of selection terminals 41 to 43. The attenuation filter 3 is mounted on the mounting board 9 and is connected between the common terminal 40 and the antenna terminal 81. The plurality of band pass filters are mounted on the mounting board 9 and are connected to the plurality of selection terminals 41 to 43. The plurality of band pass filters have a first band pass filter (the first reception filter 22A) and a second band pass filter (the second reception filter 22B). The first band pass filter is connected to the first selection terminal 41 and is a filter having a pass band, which is a first frequency band. The second band pass filter is connected to the second selection terminal 42 and is a filter having a pass band, which is a second frequency band, which is higher than the first frequency band. The attenuation filter 3 is a low pass filter or a notch filter including at least one reactive element out of an inductive element (for example, an inductor 32) and a capacitive element (for example, a capacitor 35) (shown in FIG. 2).

In the radio frequency module 1, the reactive element described above (for example, the inductor 32) is adjacent to at least one band pass filter (for example, the first reception filter 22A) out of the plurality of band pass filters. In the present specification and so forth, "adjacent" indicates that another electronic component is not present between two adjacent electronic components.

In the radio frequency module 1 and the communication device 300 according to the present embodiment, the plurality of band pass filters have the first band pass filter and the second band pass filter. The reactive element described above and included in the attenuation filter 3 is adjacent to at least one band pass filter out of the plurality of band pass filters. Consequently, the reactive element described above and a portion of the at least one band pass filter out of the plurality of band pass filters (for example, a bump 24) can be magnetically or capacitively coupled with each other. As a result, the pass band of the attenuation filter 3 can be shifted to the low frequency side such that a harmonic wave component of a signal (a reception signal) that passes through the first band pass filter (for example, the first reception filter 22A), which is a band pass filter corresponding to relatively low frequencies, does not pass through the attenuation filter 3. Consequently, the degradation of the filter characteristic of the second band pass filter, which is a band pass filter corresponding to relatively high frequencies, due to the harmonic wave component of a signal that passes through the first band pass filter, which is a band pass filter corresponding to relatively low frequencies, can be suppressed.

(2) Individual Constituent Elements of Radio Frequency Module

The radio frequency module 1 according to the present embodiment includes a power amplifier 11, a low noise amplifier 21, a plurality of filter units 2 (three filter units in the illustrated example), the attenuation filter 3, and a matching circuit 7 as illustrated in FIG. 1. Moreover, the radio frequency module 1 includes an output matching circuit 13, an input matching circuit 23, a first switch 4, a second switch 5, and a third switch 6. In the following description, in a case where the plurality of filter units 2 are distinguished from each other, the plurality of filter units 2 are also individually called "first filter unit 2A", "second filter unit 2B", and "third filter unit 2C".

(2.1) Power Amplifier

The power amplifier 11 has an input terminal 111 and an output terminal 112. The power amplifier 11 amplifies transmission signals of a first communication band, a second communication band, and a third communication band inputted to the input terminal 111 and outputs the amplified transmission signals from the output terminal 112. The first communication band corresponds to a transmission signal passing through the first transmission filter 12A and is, for example, Band 12. The second communication band corresponds to a transmission signal passing through the second transmission filter 12B and is, for example, Band 14. The third communication band corresponds to a transmission signal passing through the third transmission filter 12C and is, for example, Band 26. The output terminal 112 of the power amplifier 11 is connected to a common terminal 50 of the second switch 5 with the output matching circuit 13 interposed therebetween. The input terminal 111 of the power amplifier 11 is connected to a signal input terminal 82. The input terminal 111 of the power amplifier 11 is connected to, for example, the signal processing circuit 301 with the signal input terminal 82 interposed therebetween. The signal input terminal 82 is a terminal for inputting a radio frequency signal (transmission signal) from an external circuit (for example, the signal processing circuit 301) to the radio frequency module 1.

(2.2) Low Noise Amplifier

The low noise amplifier 21 has an input terminal 211 and an output terminal 212. The low noise amplifier 21 amplifies reception signals of a fourth communication band, a fifth communication band, and a sixth communication band inputted to the input terminal 211 and outputs the amplified reception signals from the output terminal 212. The fourth communication band corresponds to a reception signal passing through the first reception filter 22A and is, for example, Band 12. The fifth communication band corresponds to a reception signal passing through the second reception filter 22B and is, for example, Band 14. The sixth communication band corresponds to a reception signal passing through the third reception filter 22C and is, for example, Band 26. The input terminal 211 of the low noise amplifier 21 is connected to a common terminal 60 of the third switch 6 with the input matching circuit 23 interposed therebetween. The output terminal 212 of the low noise amplifier 21 is connected to a signal output terminal 83. The output terminal 212 of the low noise amplifier 21 is connected to, for example, the signal processing circuit 301 with the signal output terminal 83 interposed therebetween. The signal output terminal 83 is a terminal for outputting a radio frequency signal (reception signal) from the low noise amplifier 21 to an external circuit (for example, the signal processing circuit 301).

In the present embodiment, for example, the reception band of the fourth communication band is the first frequency band, and the reception band of the fifth communication band is the second frequency band.

(2.3) First Filter Unit

The first filter unit 2A includes the first transmission filter 12A and the first reception filter 22A. That is, in the first filter unit 2A, the first transmission filter 12A and the first reception filter 22A are integrated on one chip (see FIGS. 1 and 3). The first transmission filter 12A is, for example, a filter having a pass band, which is the transmission band of the first communication band. The first reception filter 22A is, for example, a filter having a pass band, which is the reception band of the fourth communication band. That is, in the present embodiment, the first reception filter 22A is the first band pass filter having a pass band, which is the first frequency band.

Each of the first transmission filter 12A and the first reception filter 22A is, for example, an acoustic wave filter. In each of the first transmission filter 12A and the first reception filter 22A, a plurality of series arm resonators and a plurality of parallel arm resonators each include an acoustic wave resonator. The acoustic wave resonator is, for example, a surface acoustic wave (SAW) resonator.

The SAW resonator includes, for example, a piezoelectric substrate and an interdigital transducer (IDT) electrode provided on the piezoelectric substrate. In a case where each of the plurality of series arm resonators and the plurality of parallel arm resonators is formed to include a SAW resonator, each of the first transmission filter 12A and the first reception filter 22A has a plurality of interdigital transducer (IDT) electrodes corresponding to the plurality of series arm resonators in a one-to-one relationship and a plurality of IDT electrodes corresponding to the plurality of parallel arm resonators in a one-to-one relationship on one piezoelectric substrate. The piezoelectric substrate is, for example, a lithium tantalate substrate or a lithium niobate substrate.

(2.4) Second Filter Unit

The second filter unit 2B includes the second transmission filter 12B and the second reception filter 22B. That is, in the second filter unit 2B, the second transmission filter 12B and the second reception filter 22B are integrated on one chip (see FIGS. 1 and 3). The second transmission filter 12B is, for example, a filter having a pass band, which is the transmission band of the second communication band. The second reception filter 22B is, for example, a filter having a pass band, which is the reception band of the fifth communication band. That is, in the present embodiment, the second reception filter 22B is the second band pass filter having a pass band, which is the second frequency band, which is higher than the first frequency band.

Each of the second transmission filter 12B and the second reception filter 22B is, for example, an acoustic wave filter. In each of the second transmission filter 12B and the second reception filter 22B, a plurality of series arm resonators and a plurality of parallel arm resonators each include an acoustic wave resonator. The acoustic wave resonator is, for example, a SAW resonator.

(2.5) Third Filter Unit

The third filter unit 2C includes the third transmission filter 12C and the third reception filter 22C. That is, in the third filter unit 2C, the third transmission filter 12C and the third reception filter 22C are integrated on one chip (see FIGS. 1 and 3). The third transmission filter 12C is, for example, a filter having a pass band, which is the transmission band of the third communication band. The third reception filter 22C is, for example, a filter having a pass band, which is the reception band of the sixth communication band.

Each of the third transmission filter 12C and the third reception filter 22C is, for example, an acoustic wave filter. In each of the third transmission filter 12C and the third reception filter 22C, a plurality of series arm resonators and a plurality of parallel arm resonators each include an acoustic wave resonator. The acoustic wave resonator is, for example, a SAW resonator.

In the radio frequency module 1, the plurality of band pass filters are constituted by the first transmission filter 12A, the second transmission filter 12B, the third transmission filter 12C, the first reception filter 22A, the second reception filter 22B, and the third reception filter 22C.

(2.6) First Switch

The first switch 4 has the common terminal 40 and the plurality of selection terminals 41 to 43 (three selection terminals in the illustrated example). The common terminal 40 is connected to the antenna terminal 81 with the attenuation filter 3 interposed therebetween. The antenna 310 is connected to the antenna terminal 81. The selection terminal 41 is connected to a connection point connecting an output terminal of the first transmission filter 12A to an input terminal of the first reception filter 22A. The selection terminal 42 is connected to a connection point connecting an output terminal of the second transmission filter 12B to an input terminal of the second reception filter 22B. The selection terminal 43 is connected to a connection point connecting an output terminal of the third transmission filter 12C to an input terminal of the third reception filter 22C. The first switch 4 is a switch that can simultaneously connect, for example, at least the selection terminals 41 and 42 out of the plurality of selection terminals 41 to 43 to the common terminal 40. That is, the first switch 4 is a switch that allows one-to-many connections.

The first switch 4 is controlled by, for example, the signal processing circuit 301. The first switch 4 switches a connection state between the common terminal 40 and the plurality of selection terminals 41 to 43 in accordance with a control signal from a radio frequency (RF) signal processing circuit 302 of the signal processing circuit 301. The first switch 4 is, for example, a switch integrated circuit (IC).

(2.7) Second Switch

The second switch 5 has the common terminal 50 and a plurality of selection terminals 51 to 53 (three selection terminals in the illustrated example). The common terminal 50 is connected to the output terminal 112 of the power amplifier 11 with the output matching circuit 13 interposed therebetween. The selection terminal 51 is connected to an input terminal of the first transmission filter 12A. The selection terminal 52 is connected to an input terminal of the second transmission filter 12B. The selection terminal 53 is connected to an input terminal of the third transmission filter 12C. The second switch 5 is a switch that can simultaneously connect, for example, at least two or more selection terminals out of the plurality of selection terminals 51 to 53 to the common terminal 50. That is, the second switch 5 is a switch that allows one-to-many connections.

The second switch 5 is controlled by, for example, the signal processing circuit 301. The second switch 5 switches a connection state between the common terminal 50 and the plurality of selection terminals 51 to 53 in accordance with a control signal from the RF signal processing circuit 302 of the signal processing circuit 301. The second switch 5 is, for example, a switch IC.

(2.8) Third Switch

The third switch 6 has the common terminal 60 and a plurality of selection terminals 61 to 63 (three selection terminals in the illustrated example). The common terminal 60 is connected to the input terminal 211 of the low noise amplifier 21 with the input matching circuit 23 interposed therebetween. The selection terminal 61 is connected to an output terminal of the first reception filter 22A. The selection terminal 62 is connected to an output terminal of the second reception filter 22B. The selection terminal 63 is connected to an output terminal of the third reception filter 22C. The third switch 6 is a switch that can simultaneously connect, for example, at least two or more selection terminals out of the plurality of selection terminals 61 to 63 to the common terminal 60. That is, the third switch 6 is a switch that allows one-to-many connections.

The third switch 6 is controlled by, for example, the signal processing circuit 301. The third switch 6 switches a connection state between the common terminal 60 and the plurality of selection terminals 61 to 63 in accordance with a control signal from the RF signal processing circuit 302 of the signal processing circuit 301. The third switch 6 is, for example, a switch IC.

(2.9) Attenuation Filter

The attenuation filter 3 is provided along a signal path between the antenna terminal 81 and the common terminal 40 of the first switch 4. The attenuation filter 3 attenuates a harmonic wave component of a reception signal received through the antenna 310. The attenuation filter 3 is, for example, a low pass filter. The attenuation filter 3 is, for example, a filter having a pass band, which is the reception band of Band 1.

Figure 2:
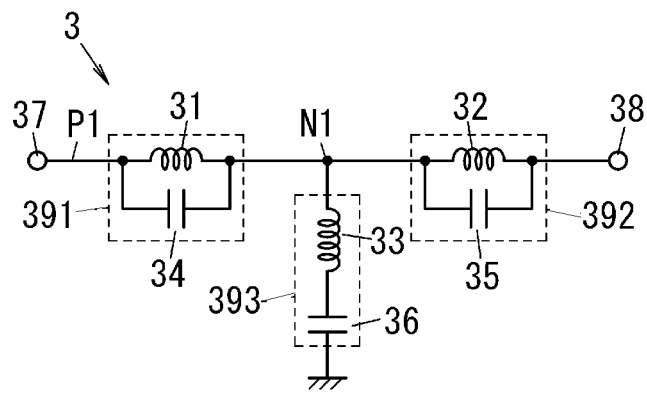
FIG. 2 is a circuit configuration diagram of an attenuation filter of the radio frequency module according to the first embodiment.

As illustrated in FIG. 2, the attenuation filter 3 has a plurality of inductors 31 to 33 (three inductors in the illustrated example), a plurality of capacitors 34 to 36 (three capacitors in the illustrated example), an input terminal 37, and an output terminal 38.

The inductor 31 and the capacitor 34 are connected in parallel and form a parallel circuit 391. The parallel circuit 391 is provided between the input terminal 37 and a node N1 on a path P1 between the input terminal 37 and the output terminal 38.

The inductor 32 and the capacitor 35 are connected in parallel and form a parallel circuit 392. The parallel circuit 392 is provided between the node N1 and the output terminal 38. The parallel circuit 392 is connected in series with the parallel circuit 391 on the path P1. That is, in the attenuation filter 3, the parallel circuit 391 is positioned on the input terminal 37 side, and the parallel circuit 392 is positioned on the output terminal 38 side on the path P1.

The inductor 33 and the capacitor 36 are connected in series and form a series circuit 393. The series circuit 393 is provided between the node N1 and ground.

(2.10) Output Matching Circuit

The output matching circuit 13 is provided along a signal path between the output terminal 112 of the power amplifier 11 and the common terminal 50 of the second switch 5. The output matching circuit 13 is a circuit for achieving impedance matching between the first, second, and third transmission filters 12A, 12B, and 12C and the power amplifier 11.

The output matching circuit 13 includes, for example, one inductor but not limited to this. The output matching circuit 13 may include a plurality of inductors and a plurality of capacitors.

(2.11) Input Matching Circuit

The input matching circuit 23 is provided along a signal path between the input terminal 211 of the low noise amplifier 21 and the common terminal 60 of the third switch 6. The input matching circuit 23 is a circuit for achieving impedance matching between the first, second, and third reception filters 22A, 22B, and 22C and the low noise amplifier 21. The input matching circuit 23 includes, for example, one inductor but not limited to this. The input matching circuit 23 may include a plurality of inductors and a plurality of capacitors.

(2.12) Matching Circuit

The matching circuit 7 has a plurality of inductors 71 to 73 (three inductors in the illustrated example).

The inductor 71 is an inductor for achieving impedance matching between the first filter unit 2A, which in other words is the first transmission filter 12A and the first reception filter 22A, and the attenuation filter 3. The inductor 71 is provided, for example, along a signal path between the connection point connecting the output terminal of the first transmission filter 12A to the input terminal of the first reception filter 22A and the selection terminal 41 of the first switch 4. The inductor 71 is connected between the signal path and ground.

The inductor 72 is an inductor for achieving impedance matching between the second filter unit 2B, which in other words is the second transmission filter 12B and the second reception filter 22B, and the attenuation filter 3. The inductor 72 is provided, for example, along a signal path between the connection point connecting the output terminal of the second transmission filter 12B to the input terminal of the second reception filter 22B and the selection terminal 42 of the first switch 4. The inductor 72 is connected between the signal path and ground.

The inductor 73 is an inductor for achieving impedance matching between the third filter unit 2C, which in other words is the third transmission filter 12C and the third reception filter 22C, and the attenuation filter 3. The inductor 73 is provided, for example, along a signal path between the connection point connecting the output terminal of the third transmission filter 12C to the input terminal of the third reception filter 22C and the selection terminal 43 of the first switch 4. The inductor 73 is connected between the signal path and ground.

(3) Communication Device

The communication device 300 includes the radio frequency module 1 described above and the signal processing circuit 301 as illustrated in FIG. 1. The communication device 300 further includes the antenna 310. The signal processing circuit 301 includes the RF signal processing circuit 302 and a baseband signal processing circuit 303. In the present embodiment, the RF signal processing circuit 302 and the baseband signal processing circuit 303 form a signal processing circuit that processes a first signal and a second signal.

(3.1) RF Signal Processing Circuit

The RF signal processing circuit 302 is, for example, an RF integrated circuit (RFIC) and performs signal processing on a radio frequency signal. The RF signal processing circuit 302 performs signal processing such as upconversion on, for example, a radio frequency signal (a transmission signal) outputted from the baseband signal processing circuit 303 and outputs the radio frequency signal subjected to the signal processing.

(3.2) Baseband Signal Processing Circuit

The baseband signal processing circuit 303 is, for example, a baseband integrated circuit (BBIC) and performs predetermined signal processing on a transmission signal from outside the signal processing circuit 301. The reception signal processed by the baseband signal processing circuit 303 is used, for example, as an image signal for image display or as an audio signal for a telephone call. The radio frequency module 1 transfers a radio frequency signal (a reception signal, a transmission signal) between the antenna 310 and the RF signal processing circuit 302 of the signal processing circuit 301. In the communication device 300, the baseband signal processing circuit 303 is an inessential constituent element.

(4) Arrangement of Individual Constituent Elements of Radio Frequency Module

Next, the arrangement of individual constituent elements of the radio frequency module 1 on the mounting board 9 will be described with reference to FIG. 3. In the following description, up-down and left-right directions are each defined as the directions illustrated in FIG. 3. That is, in an example illustrated in FIG. 3, the direction in which the first filter unit 2A and the second filter unit 2B are aligned corresponds to the up-down direction (the first filter unit 2A is on the upper side), and the direction in which the first switch 4 and the attenuation filter 3 are aligned corresponds to the left-right direction (the first switch 4 is on the left).

Figure 3:
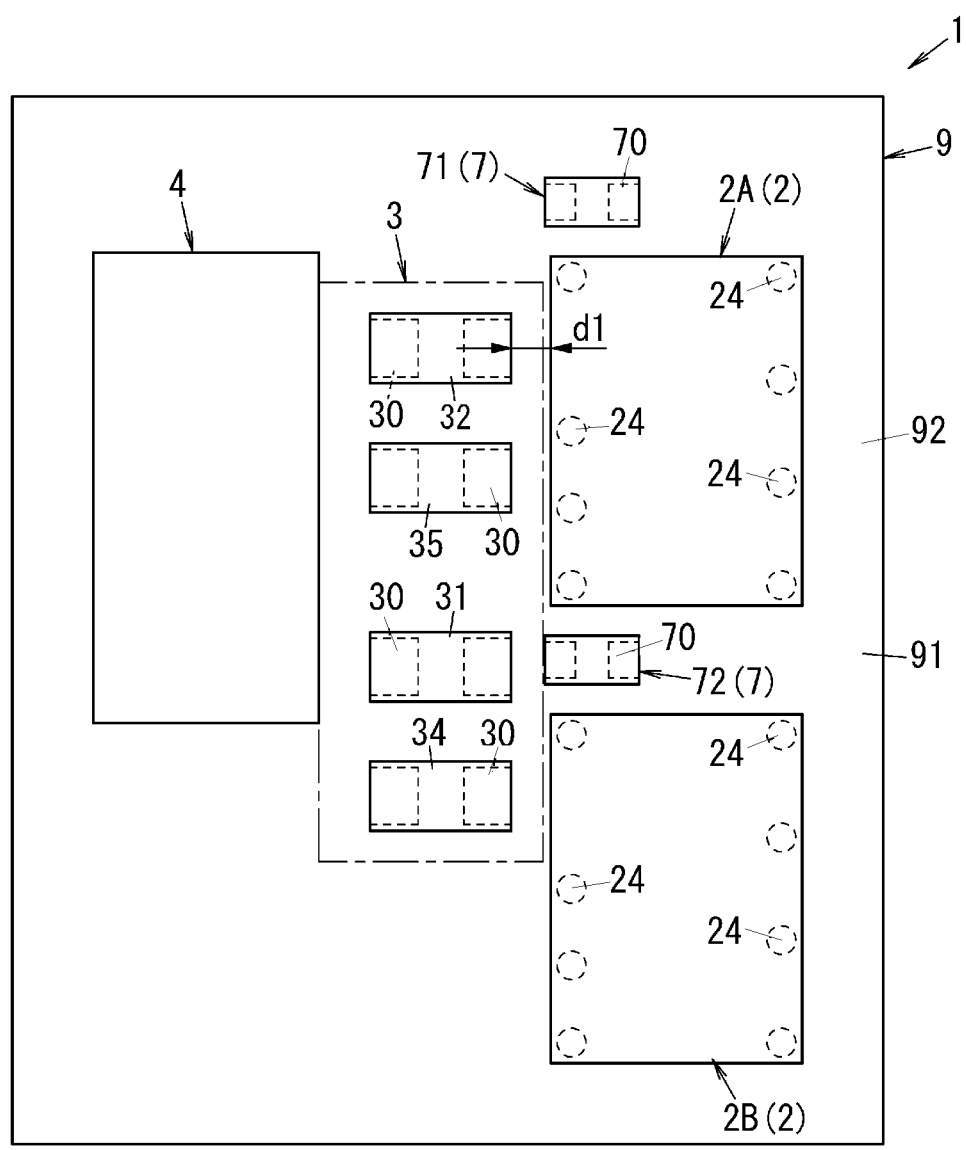
FIG. 3 is a schematic plan view illustrating the arrangement of individual constituent elements of the radio frequency module according to the first embodiment.

The radio frequency module 1 according to the present embodiment further includes the mounting board 9 as illustrated in FIG. 3. The mounting board 9 has a rectangular shape when viewed in a plan view from the thickness direction of the mounting board 9 (the direction perpendicular to the sheet of FIG. 3). The mounting board 9 has a first main surface 91 and a second main surface 92. The first main surface 91 and the second main surface 92 face with each other in the thickness direction of the mounting board 9. The mounting board 9 is, for example, a printed wiring board or a low temperature co-fired ceramics (LTCC) substrate.

The mounting board 9 is, for example, a multi-layer substrate including a plurality of dielectric layers and a plurality of conductive pattern layers. The plurality of dielectric layers and the plurality of conductive pattern layers are stacked in the thickness direction of the mounting board 9. The plurality of conductive pattern layers are each formed to have a predetermined pattern. Each of the plurality of conductive pattern layers includes one or more conductor portions in a plane perpendicular to the thickness direction of the mounting board 9. A material of each conductive pattern layer is, for example, copper. The plurality of conductive pattern layers include a ground layer.

In the radio frequency module 1, the first filter unit 2A, the second filter unit 2B, the attenuation filter 3, the first switch 4, and the inductors 71 and 72 of the matching circuit 7 described above are mounted on the first main surface 91 of the mounting board 9. Note that the third filter unit 2C, the second switch 5, the third switch 6, the inductor 73 of the matching circuit 7, the power amplifier 11, the low noise amplifier 21, the output matching circuit 13, and the input matching circuit 23 described above are mounted on the first main surface 91 or the second main surface 92 of the mounting board 9 although the illustration thereof is omitted.

The attenuation filter 3 is mounted substantially on the center of the first main surface 91 of the mounting board 9.

In the attenuation filter 3, the inductors 31 and 32 and the capacitors 34 and 35 included in the attenuation filter 3 are arranged in the order of the inductor 32, the capacitor 35, the inductor 31, and the capacitor 34 from the top side. Each of the inductors 31 and 32 and the capacitors 34 and 35 is connected to the first main surface 91 of the mounting board 9 by a connection portion 30. The connection portion 30 is, for example, solder. Note that as with the inductors 31 and 32 and the capacitors 34 and 35, the inductor 33 and the capacitor 36 included in the attenuation filter 3 are connected to the first main surface 91 of the mounting board 9 by the connection portions 30 although the illustration thereof is omitted.

The first switch 4 is mounted to the left of the attenuation filter 3 on the first main surface 91 of the mounting board 9. The first switch 4 is connected to the first main surface 91 of the mounting board 9 with, for example, solder.

The first filter unit 2A and the second filter unit 2B are mounted to the right of the attenuation filter 3 on the first main surface 91 of the mounting board 9. The first filter unit 2A and the second filter unit 2B are aligned with a space therebetween in the up-down direction such that the first filter unit 2A is positioned on the upper side and the second filter unit 2B is positioned on the lower side. Each of the first filter unit 2A and the second filter unit 2B is connected to the first main surface 91 of the mounting board 9 by a plurality of connection portions 24. The connection portions 24 are, for example, solder bumps but may also be gold bumps.

On the first main surface 91 of the mounting board 9, the inductor 71 of the matching circuit 7 is mounted above the first filter unit 2A. That is, the first filter unit 2A and the inductor 71 are aligned with a space therebetween in the up-down direction such that the inductor 71 is positioned on the upper side and the first filter unit 2A is positioned on the lower side. On the first main surface 91 of the mounting board 9, the inductor 72 of the matching circuit 7 is mounted above the second filter unit 2B. That is, the second filter unit 2B and the inductor 72 are aligned with a space therebetween in the up-down direction such that the inductor 72 is positioned on the upper side and the second filter unit 2B is positioned on the lower side. Thus, in the radio frequency module 1, the first filter unit 2A, the second filter unit 2B, and the inductors 71 and 72 are aligned in the order of the inductor 71, the first filter unit 2A, the inductor 72, and the second filter unit 2B from the top side. Each of the inductors 71 and 72 is connected to the first main surface 91 of the mounting board 9 by a connection portion 70. The connection portion 70 is, for example, solder.

(5) Characteristics of Radio Frequency Module

Figure 4:
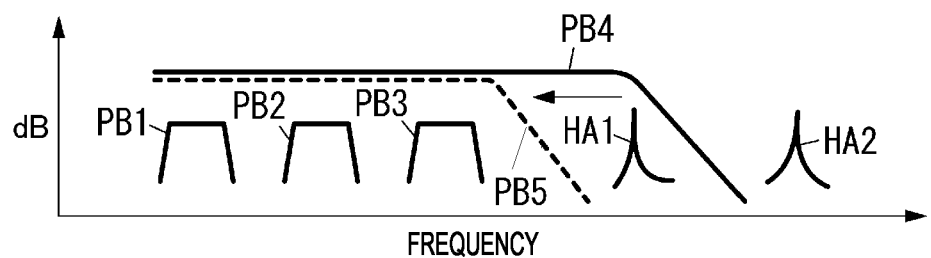
FIG. 4 is a diagram for describing characteristics of the radio frequency module according to the first embodiment.

Next, characteristics of the radio frequency module 1 will be described with reference to FIGS. 3 and 4. In FIG. 4, "PB1" denotes the pass band of the first reception filter 22A, "PB2" denotes the pass band of the second reception filter 22B, and "PB3" denotes the pass band of the third reception filter 22C. Moreover, in FIG. 4, "PB4" denotes the pass band of an attenuation filter according to a comparative example, and "PB5" denotes the pass band of the attenuation filter 3 according to the present embodiment. Furthermore, in FIG. 4, "HA1" denotes a harmonic wave (for example, a second harmonic wave) of a reception signal that passes through the first reception filter 22A, and "HA2" denotes a harmonic wave (for example, a second harmonic wave) of a reception signal that passes through the third reception filter 22C. Note that a solid line representing the pass band PB4 and a broken line representing the pass band PB5 are shifted from each other and illustrated in the drawing so that the lines are easy to be distinguished from each other; however, in reality, the straight sections extending in the horizontal axis direction at least partially overlap.

In the radio frequency module 1 according to the present embodiment, the reception band of Band 12 is treated as the pass band of the fourth communication band, which is the communication band of the first reception filter 22A, the reception band of Band 14 is treated as the pass band of the fifth communication band, which is the communication band of the second reception filter 22B, and the reception band of Band 26 is treated as the pass band of the sixth communication band, which is the communication band of the third reception filter 22C. Thus, the pass bands PB1, PB2, and PB3 are arranged in the order of the pass band PB1, the pass band PB2, and the pass band PB3 from the low frequency side.

In the attenuation filter according to the comparative example, a harmonic wave HA' of a reception signal that passes through the first reception filter 22A is included in the pass band PB4. Thus, for example, in a case where the harmonic wave HA' overlaps an attenuation region of the second reception filter 22B, the filter characteristic of the second reception filter 22B is degraded. Note that even in this case, a harmonic wave HA2 of a reception signal that passes through the third reception filter 22C is not included in the pass band PB4 of the attenuation filter according to the comparative example. Thus, the filter characteristic of the second reception filter 22B is not degraded by the harmonic wave HA2.

In the radio frequency module 1 according to the present embodiment, for example, the inductor 32 (an inductive element) and the capacitor 35 (a capacitive element) included in the attenuation filter 3 are adjacent to the first filter unit 2A (the first reception filter 22A) in a plan view from the thickness direction of the mounting board 9 as illustrated in FIG. 3. That is, in FIG. 3, another electronic component is not present between the inductor 32 and capacitor 35 of the attenuation filter 3 and the first reception filter 22A. In the radio frequency module 1, the inductor 31 included in the attenuation filter 3 is adjacent to the inductor 72 of the matching circuit 7. That is, in FIG. 3, another electronic component is not present between the inductor 31 of the attenuation filter 3 and the inductor 72 of the matching circuit 7. Furthermore, in the radio frequency module 1, the capacitor 34 included in the attenuation filter 3 is adjacent to the second filter unit 2B (the second reception filter 22B). That is, in FIG. 3, another electronic component is not present between the capacitor 34 of the attenuation filter 3 and the second reception filter 22B. In the present embodiment, for example, the connection portions 24 for connecting the first reception filter 22A to the mounting board 9 are adjacent to the inductor 32 and the capacitor 35. Moreover, for example, the connection portions 24 for connecting the second reception filter 22B to the mounting board 9 are adjacent to the capacitor 34. In the present embodiment, the inductor 32 included in the attenuation filter 3 is a reactive element.

Here, in a case where the distance between the inductor 32 of the attenuation filter 3 and the connection portions 24 of the first reception filter 22A is denoted by d1 and the stray capacitance between the inductor 32 and the connection portions 24 is denoted by C1, the stray capacitance C1 is inversely proportional to the distance d1, and thus the shorter the distance d1, the greater the stray capacitance C1. In a case where the resonant frequency of the attenuation filter 3 is denoted by f1, the resonant frequency f1 is inversely proportional to the stray capacitance C1, and thus the greater the stray capacitance C1, the lower the resonant frequency f1. Thus, by reducing the distance d1 between the inductor 32 of the attenuation filter 3 and the connection portions 24 of the first reception filter 22A, the pass band PB5 of the attenuation filter 3 can be shifted to the low frequency side (see FIG. 4). That is, the pass band PB5 of the attenuation filter 3 can be shifted to the low frequency side by capacitively coupling the inductor 32 (an inductive element) of the attenuation filter 3 with the connection portions 24 of the first reception filter 22A. Note that substantially the same applies to the inductor 31 and the capacitors 34 and 35 included in the attenuation filter 3.

As described above, by shifting the pass band PB5 of the attenuation filter 3 to the low frequency side, a harmonic wave component HA1 of a reception signal that passes through the first reception filter 22A is blocked by the attenuation filter 3. Consequently, the degradation of the filter characteristic of the second reception filter 22B, which corresponds to relatively high frequencies, due to the harmonic wave component HA1 of a reception signal that passes through the first reception filter 22A, which corresponds to relatively low frequencies, can be suppressed.

(6) Modification

In the following, a modification of the radio frequency module 1 according to the first embodiment will be described.

(6.1) First Modification

Figure 5:
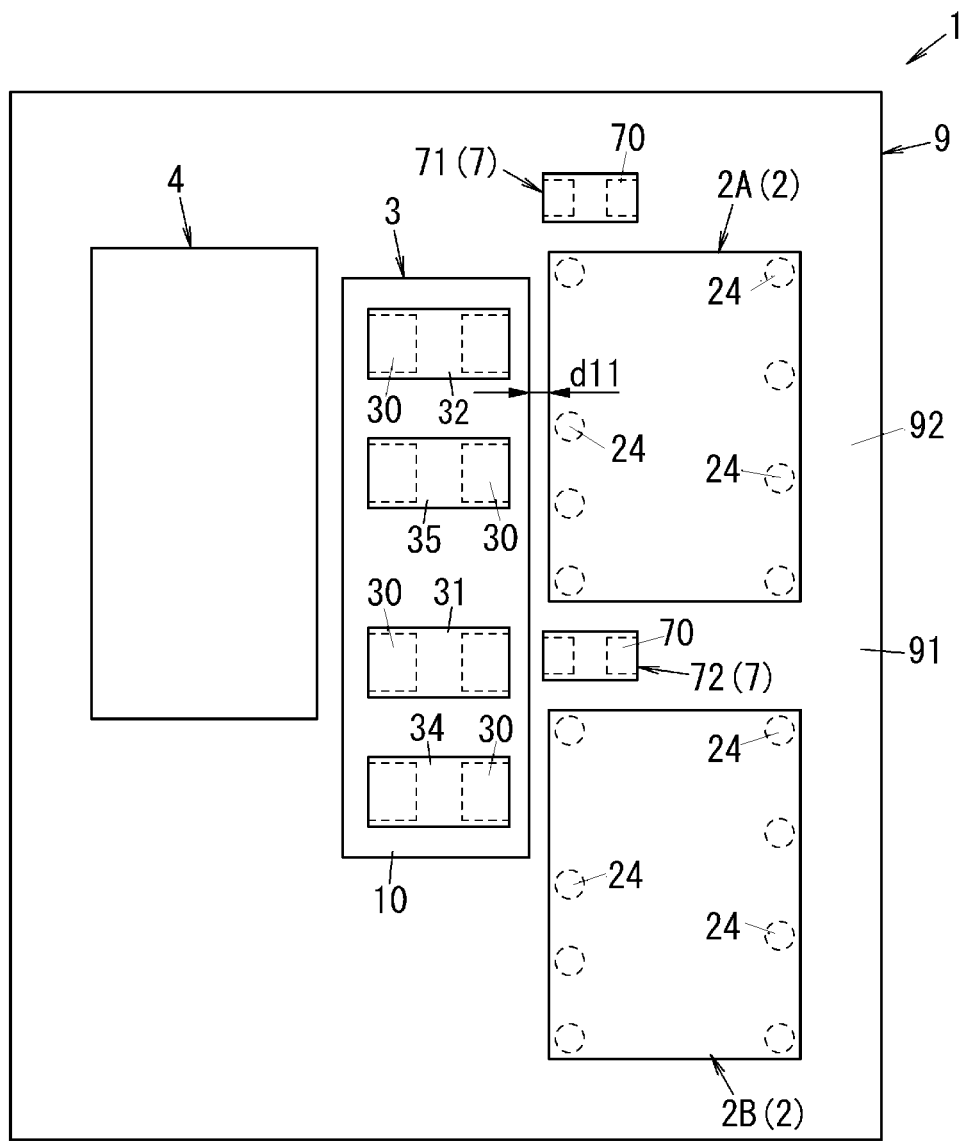
FIG. 5 is a schematic plan view illustrating the arrangement of individual constituent elements of a radio frequency module according to a first modification of the first embodiment.

A radio frequency module 1 according to a first modification of the first embodiment will be described with reference to FIG. 5. Regarding the radio frequency module 1 according to the first modification, the constituent elements substantially the same as those of the radio frequency module 1 according to the first embodiment will be denoted by the same reference numerals, and the description thereof will be omitted.

The radio frequency module 1 according to the first modification differs from the radio frequency module 1 according to the first embodiment in that the attenuation filter 3 including a plurality of reactive elements (the inductors 31 to 33 and the capacitors 34 to 36) is formed as one chip 10.

In the radio frequency module 1 according to the first modification, in a case where the mounting board 9 is viewed in a plan view, the chip 10 including the plurality of reactive elements is adjacent to the first filter unit 2A. In the example illustrated in FIG. 5, the distance between the chip 10 and the first filter unit 2A is d11. In this manner, by causing the chip 10 including the attenuation filter 3 to be adjacent to the first filter unit 2A, the degradation of the filter characteristic of a band pass filter corresponding to relatively high frequencies (for example, the second reception filter 22B) due to a harmonic wave component of a signal that passes through a band pass filter corresponding to relatively low frequencies (for example, the first reception filter 22A) can be suppressed.

(6.2) Another Modification

The radio frequency module 1 in the first embodiment includes the first transmission filter 12A, the second transmission filter 12B, the third transmission filter 12C, the first reception filter 22A, the second reception filter 22B, and the third reception filter 22C as the plurality of band pass filters. In contrast to this, the radio frequency module 1 may include only the first reception filter 22A, the second reception filter 22B, and the third reception filter 22C, which are reception filters, as the plurality of band pass filters. In this case, it is sufficient that the number of reception filters included in the radio frequency module 1 be at least one.

In the first embodiment, the number of attenuation filters 3 provided between the antenna 310 and the first switch 4 is one; however, for example, a plurality of attenuation filters may be provided between the antenna 310 and the first switch 4.

In the first embodiment, the inductors 31 and 32 and the capacitors 34 and 35 constituting a portion of the attenuation filter 3 are made adjacent to the first reception filter 22A, the second reception filter 22B, or the inductor 72 of the matching circuit 7. In contrast to this, at least one out of the inductors 31, 32, and 33 and the capacitors 34, 35, and 36 included in the attenuation filter 3 may be made adjacent to the first reception filter 22A, the second reception filter 22B, or the inductor 72 of the matching circuit 7.

Second Embodiment

A radio frequency module 1A and a communication device 300A according to a second embodiment will be described with reference to FIGS. 6 to 8.

Figure 6:
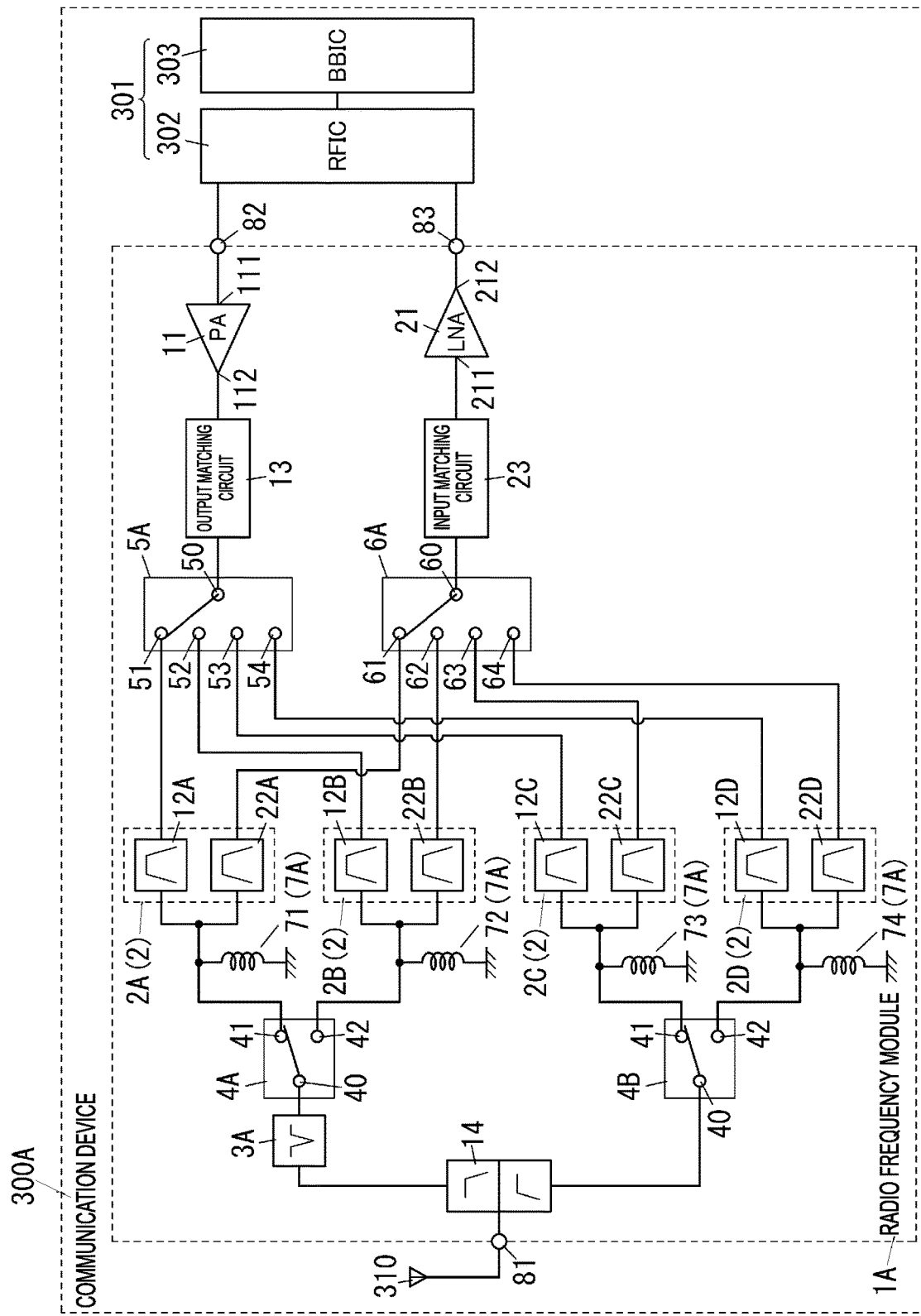
FIG. 6 is a circuit configuration diagram of a communication device including a radio frequency module according to a second embodiment.

The communication device 300A according to the present embodiment includes the radio frequency module 1A and the signal processing circuit 301 as illustrated in FIG. 6. The communication device 300A further includes the antenna 310. The signal processing circuit 301 includes the RF signal processing circuit 302 and the baseband signal processing circuit 303. Note that the signal processing circuit 301 and the antenna 310 are substantially the same as those of the communication device 300 according to the first embodiment, and thus only the radio frequency module 1A will be described in the following.

(1) Configuration of Radio Frequency Module

The radio frequency module 1A according to the second embodiment includes the power amplifier 11, the low noise amplifier 21, a plurality of filter units 2 (four filter units in the illustrated example), an attenuation filter 3A, and a matching circuit 7A as illustrated in FIG. 6. Moreover, the radio frequency module 1A includes the output matching circuit 13, the input matching circuit 23, a plurality of first switches 4A and 4B (two switches in the illustrated example), a second switch 5A, a third switch 6A, and a multiplexer 14. In the following description, in a case where the plurality of filter units 2 are distinguished from each other, the plurality of filter units 2 are also individually called "first filter unit 2A", "second filter unit 2B", "third filter unit 2C", and "fourth filter unit 2D". The power amplifier 11, the low noise amplifier 21, the output matching circuit 13, and the input matching circuit 23 are substantially the same as those of the radio frequency module 1 according to the first embodiment, and thus the description thereof will be omitted here.

(1.1) First Filter Unit

The first filter unit 2A includes the first transmission filter 12A and the first reception filter 22A. That is, in the first filter unit 2A, the first transmission filter 12A and the first reception filter 22A are integrated on one chip (see FIGS. 6 and 8). The first transmission filter 12A is, for example, a filter having a pass band, which is the transmission band of a first communication band. The first reception filter 22A is, for example, a filter having a pass band, which is the reception band of the first communication band. The first communication band is, for example, Band 12.

(1.2) Second Filter Unit

The second filter unit 2B includes the second transmission filter 12B and the second reception filter 22B. That is, in the second filter unit 2B, the second transmission filter 12B and the second reception filter 22B are integrated on one chip (see FIGS. 6 and 8). The second transmission filter 12B is, for example, a filter having a pass band, which is the transmission band of a second communication band. The second reception filter 22B is, for example, a filter having a pass band, which is the reception band of the second communication band. The second communication band is, for example, Band 26.

(1.3) Third Filter Unit

The third filter unit 2C includes the third transmission filter 12C and the third reception filter 22C. That is, in the third filter unit 2C, the third transmission filter 12C and the third reception filter 22C are integrated on one chip (see FIGS. 6 and 8). The third transmission filter 12C is, for example, a filter having a pass band, which is the transmission band of a third communication band. The third reception filter 22C is, for example, a filter having a pass band, which is the reception band of the third communication band. The third communication band is, for example, Band 11.

(1.4) Fourth Filter Unit

The fourth filter unit 2D includes a fourth transmission filter 12D and a fourth reception filter 22D. That is, in the fourth filter unit 2D, the fourth transmission filter 12D and the fourth reception filter 22D are integrated on one chip (see FIGS. 6 and 8). The fourth transmission filter 12D is, for example, a filter having a pass band, which is the transmission band of a fourth communication band. The fourth reception filter 22D is, for example, a filter having a pass band, which is the reception band of the fourth communication band. The fourth communication band is, for example, Band 3. In the radio frequency module 1A, the plurality of band pass filters are constituted by the first transmission filter 12A, the second transmission filter 12B, the third transmission filter 12C, the fourth transmission filter 12D, the first reception filter 22A, the second reception filter 22B, the third reception filter 22C, and the fourth reception filter 22D.

(1.5) First Switches

Each of the plurality of first switches 4A and 4B has the common terminal 40 and the two selection terminals 41 and 42.

The common terminal 40 of the first switch 4A is connected to the antenna terminal 81 with the attenuation filter 3A and the multiplexer 14 interposed therebetween. The antenna 310 is connected to the antenna terminal 81. The selection terminal (the first selection terminal) 41 is connected to the connection point connecting the output terminal of the first transmission filter 12A to the input terminal of the first reception filter 22A. The selection terminal (the second selection terminal) 42 is connected to the connection point connecting the output terminal of the second transmission filter 12B to the input terminal of the second reception filter 22B. The first switch 4A is a switch that can simultaneously connect, for example, the two selection terminals 41 and 42 to the common terminal 40. That is, the first switch 4A is a switch that allows one-to-many connections.

The common terminal 40 of the first switch 4B is connected to the antenna terminal 81 with the multiplexer 14 interposed therebetween. The selection terminal (the first selection terminal) 41 is connected to the connection point connecting the output terminal of the third transmission filter 12C to the input terminal of the third reception filter 22C. The selection terminal (the second selection terminal) 42 is connected to a connection point connecting an output terminal of the fourth transmission filter 12D to an input terminal of the fourth reception filter 22D. The first switch 4B is a switch that can simultaneously connect, for example, the two selection terminals 41 and 42 to the common terminal 40. That is, the first switch 4B is a switch that allows one-to-many connections.

Each of the plurality of first switches 4A and 4B is controlled by, for example, the signal processing circuit 301. Each of the plurality of first switches 4A and 4B switches a connection state between the common terminal 40 and the two selection terminals 41 and 42 in accordance with a control signal from the RF signal processing circuit 302 of the signal processing circuit 301. Each of the plurality of first switches 4A and 4B is, for example, a switch IC.

(1.6) Second Switch

The second switch 5A has the common terminal 50 and four selection terminals 51 to 54. The common terminal 50 is connected to the output terminal 112 of the power amplifier 11 with the output matching circuit 13 interposed therebetween. The selection terminal 51 is connected to the input terminal of the first transmission filter 12A. The selection terminal 52 is connected to the input terminal of the second transmission filter 12B. The selection terminal 53 is connected to the input terminal of the third transmission filter 12C. The selection terminal 54 is connected to an input terminal of the fourth transmission filter 12D. The second switch 5A is a switch that can simultaneously connect, for example, at least two or more out of the four selection terminals 51 to 54 to the common terminal 50. That is, the second switch 5A is a switch that allows one-to-many connections.

The second switch 5A is controlled by, for example, the signal processing circuit 301. The second switch 5A switches a connection state between the common terminal 50 and the four selection terminals 51 to 54 in accordance with a control signal from the RF signal processing circuit 302 of the signal processing circuit 301. The second switch 5A is, for example, a switch IC.

(1.7) Third Switch

The third switch 6A has the common terminal 60 and four selection terminals 61 to 64. The common terminal 60 is connected to the input terminal 211 of the low noise amplifier 21 with the input matching circuit 23 interposed therebetween. The selection terminal 61 is connected to the output terminal of the first reception filter 22A. The selection terminal 62 is connected to the output terminal of the second reception filter 22B. The selection terminal 63 is connected to the output terminal of the third reception filter 22C. The selection terminal 64 is connected to an output terminal of the fourth reception filter 22D. The third switch 6A is a switch that can simultaneously connect, for example, at least two or more out of the four selection terminals 61 to 64 to the common terminal 60. That is, the third switch 6A is a switch that allows one-to-many connections.

The third switch 6A is controlled by, for example, the signal processing circuit 301. The third switch 6A switches a connection state between the common terminal 60 and the four selection terminals 61 to 64 in accordance with a control signal from the RF signal processing circuit 302 of the signal processing circuit 301. The third switch 6A is, for example, a switch IC.

(1.8) Attenuation Filter

The attenuation filter 3A is provided along a signal path between the multiplexer 14 and the common terminal 40 of the first switch 4A. The attenuation filter 3A attenuates a harmonic wave component of a reception signal going toward the first switch 4A out of reception signals received through the antenna 310. The attenuation filter 3A is, for example, a notch filter. The attenuation filter 3A is, for example, a filter having a pass band, which is the reception band of Band 1.

Figure 7:
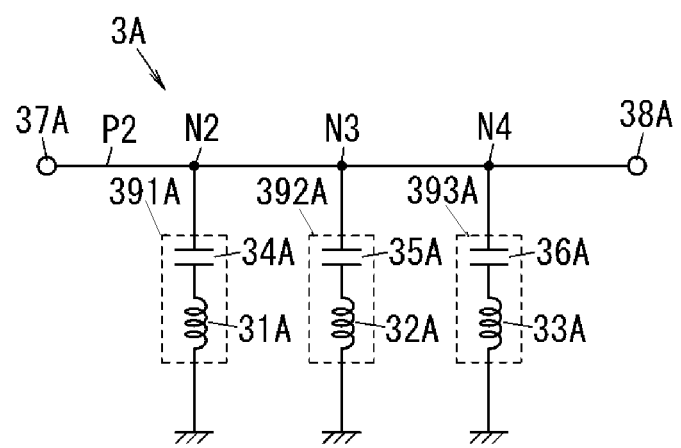
FIG. 7 is a circuit configuration diagram of an attenuation filter of the radio frequency module according to the second embodiment.

As illustrated in FIG. 7, the attenuation filter 3A has a plurality of inductors 31A to 33A (three inductors in the illustrated example), a plurality of capacitors 34A to 36A (three capacitors in the illustrated example), an input terminal 37A, and an output terminal 38A.

The inductor 31A and the capacitor 34A are connected in series and form a series circuit 391A. The series circuit 391A is provided between a node N2 and ground, the node N2 being on a path P2 between the input terminal 37A and the output terminal 38A.

The inductor 32A and the capacitor 35A are connected in series and form a series circuit 392A. The series circuit 392A is provided between a node N3 on the path P2 and ground. The node N3 is positioned closer to the output terminal 38A than the node N2 is on the path P2. Thus, the series circuit 392A is provided closer to the output terminal 38A than the series circuit 391A is.

The inductor 33A and the capacitor 36A are connected in series and form a series circuit 393A. The series circuit 393A is provided between a node N4 on the path P2 and ground. The node N4 is positioned closer to the output terminal 38A than the node N3 is on the path P2. Thus, the series circuit 393A is provided closer to the output terminal 38A than the series circuit 392A is.

(1.9) Multiplexer

The multiplexer 14 has a transmission filter and a reception filter. The multiplexer 14 is connected to, for example, the common terminal 40 of the first switch 4A with the notch filter 3A interposed therebetween on a signal path between the antenna terminal 81 and the common terminal 40 of the first switch 4A. Moreover, the multiplexer 14 is directly connected to, for example, the common terminal 40 of the first switch 4B on a signal path between the antenna terminal 81 and the common terminal 40 of the first switch 4B.

(1.10) Matching Circuit

The matching circuit 7A has a plurality of inductors 71 to 74 (four inductors in the illustrated example).

The inductor 71 is an inductor for achieving impedance matching between the first transmission and reception filters 12A and 22A and the attenuation filter 3A and multiplexer 14. The inductor 71 is provided, for example, along the signal path between the connection point connecting the output terminal of the first transmission filter 12A to the input terminal of the first reception filter 22A and the selection terminal 41 of the first switch 4A. The inductor 71 is connected between the signal path and ground.

The inductor 72 is an inductor for achieving impedance matching between the second transmission and reception filters 12B and 22B and the attenuation filter 3A and multiplexer 14. The inductor 72 is provided, for example, along the signal path between the connection point connecting the output terminal of the second transmission filter 12B to the input terminal of the second reception filter 22B and the selection terminal 42 of the first switch 4A. The inductor 72 is connected between the signal path and ground.

The inductor 73 is an inductor for achieving impedance matching between the third transmission and reception filters 12C and 22C and the multiplexer 14. The inductor 73 is provided, for example, along the signal path between the connection point connecting the output terminal of the third transmission filter 12C to the input terminal of the third reception filter 22C and the selection terminal 41 of the first switch 4B. The inductor 73 is connected between the signal path and ground.

The inductor 74 is an inductor for achieving impedance matching between the fourth transmission and reception filters 12D and 22D and the multiplexer 14. The inductor 74 is provided, for example, along a signal path between the connection point connecting the output terminal of the fourth transmission filter 12D to the input terminal of the fourth reception filter 22D and the selection terminal 42 of the first switch 4B. The inductor 74 is connected between the signal path and ground.

(2) Arrangement of Individual Constituent Elements of Radio Frequency Module

Next, the arrangement of individual constituent elements of the radio frequency module 1A on the mounting board 9 will be described with reference to FIG. 8. In the following description, up-down and left-right directions are each defined as the directions illustrated in FIG. 8. That is, in an example illustrated in FIG. 8, the direction in which the first filter unit 2A and the second filter unit 2B are aligned corresponds to the left-right direction (the first filter unit 2A is on the left), and the direction in which the first filter unit 2A and the third filter unit 2C are aligned corresponds to the up-down direction (the first filter unit 2A is on the upper side).

Figure 8:
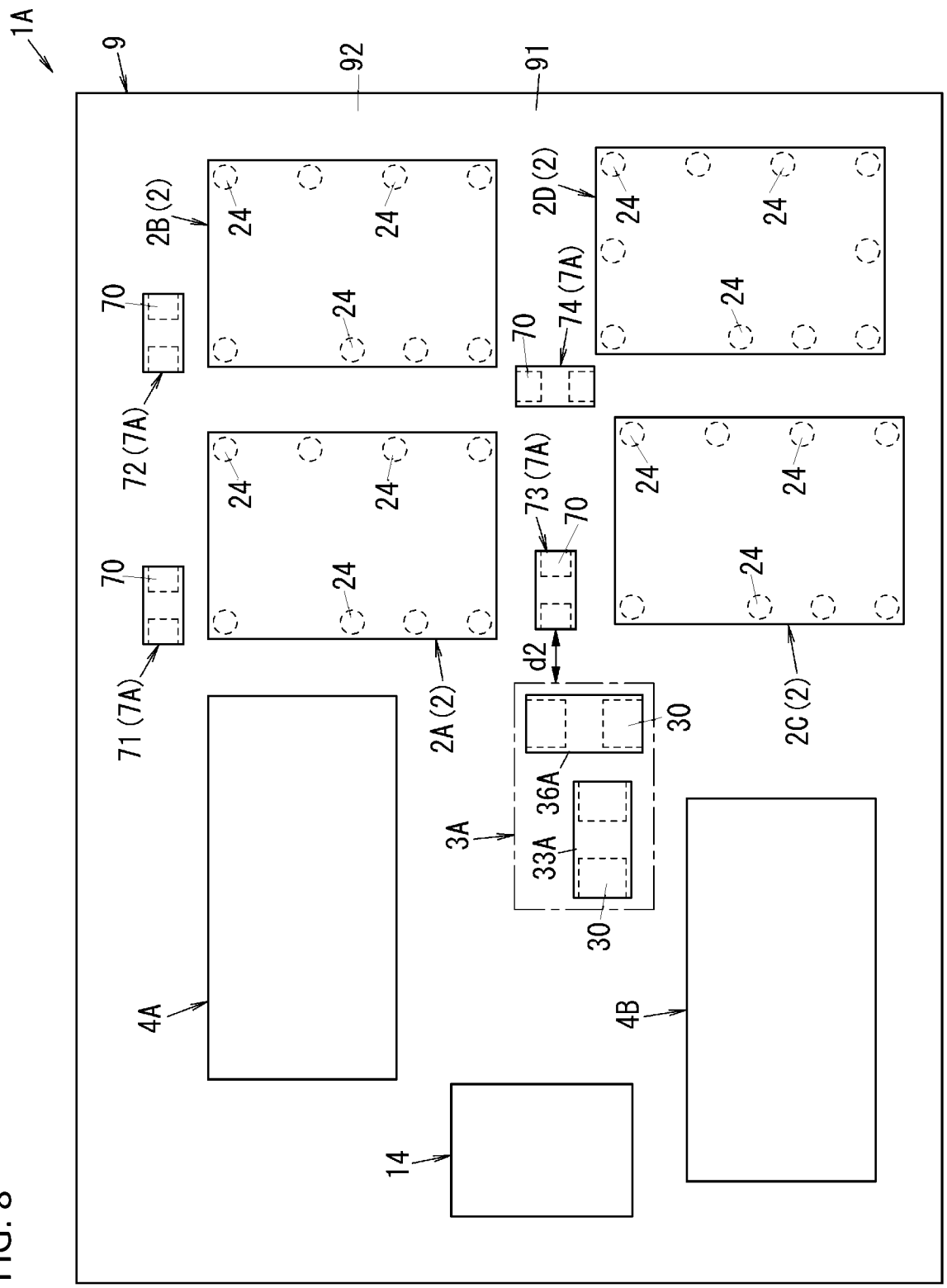
FIG. 8 is a schematic plan view illustrating the arrangement of individual constituent elements of the radio frequency module according to the second embodiment.

The radio frequency module 1A according to the present embodiment further includes the mounting board 9 as illustrated in FIG. 8. The mounting board 9 has a rectangular shape when viewed in a plan view from the thickness direction of the mounting board 9 (the direction perpendicular to the sheet of FIG. 8). The mounting board 9 has the first main surface 91 and the second main surface 92. The first main surface 91 and the second main surface 92 face with each other in the thickness direction of the mounting board 9 (the direction perpendicular to the sheet of FIG. 8). The mounting board 9 is, for example, a printed wiring board or an LTCC substrate.

The mounting board 9 is, for example, a multi-layer substrate including a plurality of dielectric layers and a plurality of conductive pattern layers. The plurality of dielectric layers and the plurality of conductive pattern layers are stacked in the thickness direction of the mounting board 9. The plurality of conductive pattern layers are each formed to have a predetermined pattern. Each of the plurality of conductive pattern layers includes one or more conductor portions in a plane perpendicular to the thickness direction of the mounting board 9. A material of each conductive pattern layer is, for example, copper. The plurality of conductive pattern layers include a ground layer.

In the radio frequency module 1A, the first filter unit 2A, the second filter unit 2B, the third filter unit 2C, the fourth filter unit 2D, the attenuation filter 3A, the first switches 4A and 4B, the matching circuit 7A, and the multiplexer 14 described above are mounted on the first main surface 91 of the mounting board 9. Note that the second switch 5A, the third switch 6A, the power amplifier 11, the low noise amplifier 21, the output matching circuit 13, and the input matching circuit 23 described above are mounted on the first main surface 91 or the second main surface 92 of the mounting board 9 although the illustration thereof is omitted.

The attenuation filter 3A, the first switches 4A and 4B, and the multiplexer 14 are mounted on the left region of the mounting board 9. The first switches 4A and 4B are aligned with a space therebetween in the up-down direction such that the first switch 4A is positioned on the upper side and the first switch 4B is positioned on the lower side. Each of the first switches 4A and 4B is connected to the first main surface 91 of the mounting board 9 with, for example, solder.

The attenuation filter 3A and the multiplexer 14 are mounted between the first switches 4A and 4B on the first main surface 91 of the mounting board 9. The attenuation filter 3A and the multiplexer 14 are aligned with a space therebetween in the left-right direction such that the multiplexer 14 is positioned on the left and the attenuation filter 3A is positioned on the right. The multiplexer 14 is connected to the first main surface 91 of the mounting board 9 with, for example, solder. In the attenuation filter 3A, the inductor 33A and the capacitor 36A included in the attenuation filter 3A are aligned in the left-right direction such that the inductor 33A is positioned on the left and the capacitor 36A is positioned on the right. Each of the inductor 33A and the capacitor 36A is connected to the first main surface 91 of the mounting board 9 by the connection portion 30. The connection portion 30 is, for example, solder. Note that the inductors 31A and 32A and the capacitors 34A and 35A included in the attenuation filter 3A are connected to the first main surface 91 of the mounting board 9 by the connection portions 30 although the illustration thereof is omitted.

The first filter unit 2A, the second filter unit 2B, the third filter unit 2C, and the fourth filter unit 2D are mounted on the right region of the first main surface 91 of the mounting board 9. The first filter unit 2A and the second filter unit 2B are aligned with a space therebetween in the left-right direction such that the first filter unit 2A is positioned on the left and the second filter unit 2B is positioned on the right. The third filter unit 2C and the fourth filter unit 2D are aligned with a space therebetween in the left-right direction such that the third filter unit 2C is positioned on the left and the fourth filter unit 2D is positioned on the right. The first filter unit 2A to the fourth filter unit 2D are aligned with a space in the up-down direction such that the first filter unit 2A and the second filter unit 2B are positioned on the upper side and the third filter unit 2C and the fourth filter unit 2D are positioned on the lower side. The first filter unit 2A, the second filter unit 2B, the third filter unit 2C, and the fourth filter unit 2D are individually connected to the first main surface 91 of the mounting board 9 by the plurality of connection portions 24. The connection portions 24 are, for example, solder bumps but may also be gold bumps.

The inductor 71 of the matching circuit 7A is mounted above the first filter unit 2A on the first main surface 91 of the mounting board 9. The inductor 72 of the matching circuit 7A is mounted above the second filter unit 2B on the first main surface 91 of the mounting board 9. The inductor 73 of the matching circuit 7A is mounted above the third filter unit 2C on the first main surface 91 of the mounting board 9. The inductor 74 of the matching circuit 7A is mounted in a region surrounded by the first filter unit 2A, the second filter unit 2B, the third filter unit 2C, and the fourth filter unit 2D on the first main surface 91 of the mounting board 9. Each of the inductors 71 and 74 is connected to the first main surface 91 of the mounting board 9 by, for example, the connection portion 70. The connection portion 70 is, for example, solder.

(3) Characteristics of Radio Frequency Module

Next, characteristics of the radio frequency module 1A will be described with reference to FIG. 8.

In the radio frequency module 1A according to the present embodiment, for example, the capacitor 36A included in the attenuation filter 3A is adjacent to the inductor 73, which is one out of the plurality of inductors 71 to 74 in a plan view from the thickness direction of the mounting board 9 as illustrated in FIG. 8. That is, in FIG. 8, another electronic component is not present between the capacitor 36A of the attenuation filter 3A and the inductor 73.

In the radio frequency module 1A, since the capacitor 36A of the attenuation filter 3A is adjacent to the inductor 73, the capacitor 36A and the inductor 73 capacitively couple with each other. In this case, the capacitance between the capacitor 36A and the inductor 73 is increased by setting a distance d2 (see FIG. 8) between the capacitor 36A and the inductor 73 to be short. By increasing the capacitance, the resonant frequency of the attenuation filter 3A is shifted to the low frequency side.

As described above, by shifting the resonant frequency of the attenuation filter 3A to the low frequency side, a harmonic wave component of a reception signal that passes through the first reception filter 22A is blocked by the attenuation filter 3A. Consequently, the degradation of the filter characteristic of the second reception filter 22B, which corresponds to relatively high frequencies, due to the harmonic wave component of the reception signal that passes through the first reception filter 22A, which corresponds to relatively low frequencies, can be suppressed. In the present embodiment, the capacitor 36A included in the attenuation filter 3A is a reactive element.

In the second embodiment, the capacitor 36A of the attenuation filter 3A is made adjacent to the inductor 73, which is one out of the plurality of inductors 71 to 74; however, at least one out of the inductors 31A to 33A and the capacitors 34A to 36A included in the attenuation filter 3A may be made adjacent to at least one out of the third reception filter 22C and the fourth reception filter 22D. At least one out of the inductors 31A to 33A and the capacitors 34A to 36A included in the attenuation filter 3A may be made close to at least one out of the inductors 73 and 74.

Furthermore, at least one out of the inductors 31A to 33A and the capacitors 34A to 36A included in the attenuation filter 3A may be made adjacent to at least one out of the first reception filter 22A and the second reception filter 22B. At least one out of the inductors 31A to 33A and the capacitors 34A to 36A included in the attenuation filter 3A may be made close to at least one out of the inductors 71 and 72.

(Summary)

The following modes are disclosed from the embodiments and the like described above.

A radio frequency module (1; 1A) according to a first mode includes a mounting board (9), a switch (4; 4A, 4B), an attenuation filter (3; 3A), and a plurality of band pass filters (12A to 12D, 22A to 22D). The switch (4; 4A, 4B) is mounted on the mounting board (9), has a common terminal (40), which is connected to an antenna terminal (81), and a plurality of selection terminals (41 to 43), which are to be connected to the common terminal (40), and is a switch that is capable of simultaneously connecting the common terminal (40) to at least a first selection terminal (41) and a second selection terminal (42) out of the plurality of selection terminals (41 to 43). The attenuation filter (3; 3A) is mounted on the mounting board (9) and is connected between the common terminal (40) and the antenna terminal (81). The plurality of band pass filters (12A to 12D, 22A to 22D) are mounted on the mounting board (9) and are connected to the plurality of selection terminals (41 to 44). The plurality of band pass filters (12A to 12D, 22A to 22D) have a first band pass filter (22A) and a second band pass filter (22B). The first band pass filter (22A) is connected to the first selection terminal (41) and is a filter having a pass band, which is a first frequency band. The second band pass filter (22B) is connected to the second selection terminal

(42) and is a filter having a pass band, which is a second frequency band, which is higher than the first frequency band. The attenuation filter is a low pass filter or a notch filter including at least one reactive element out of an inductive element (for example, the inductor 32) and a capacitive element (for example, the capacitor 35). In the radio frequency module (1; 1A), in a case where the mounting board (9) is viewed in a plan view, the reactive element is adjacent to at least one band pass filter (for example, the first reception filter 22A) out of the plurality of band pass filters (12A to 12D, 22A to 22D).

According to this mode, the degradation of the filter characteristic of a band pass filter corresponding to relatively high frequencies (for example, the second reception filter 22B) due to a harmonic wave component of a signal that passes through a band pass filter corresponding to relatively low frequencies (for example, the first reception filter 22A) can be suppressed.

In the radio frequency module (1) according to a second mode, in the first mode, the attenuation filter (3) is formed by one chip (10) including the reactive element. The attenuation filter (3) is adjacent to the at least one band pass filter in a case where the mounting board (9) is viewed in a plan view.

According to this mode, the attenuation filter 3 is formed by the one chip (10), and thus the area of the mounting board (9) in a plan view can be made small.

A radio frequency module (1; 1A) according to a third mode includes a mounting board (9), a switch (4; 4A, 4B), an attenuation filter (3; 3A), a plurality of band pass filters (12A to 12D, 22A to 24D), and a plurality of inductors (71 to 73). The switch (4; 4A, 4B) is mounted on the mounting board (9), has a common terminal (40), which is connected to an antenna terminal (81), and a plurality of selection terminals (41 to 43), which are to be connected to the common terminal (40), and is a switch that is capable of simultaneously connecting the common terminal (40) to at least a first selection terminal (41) and a second selection terminal (42) out of the plurality of selection terminals (41 to 43). The attenuation filter (3; 3A) is mounted on the mounting board (9) and is connected between the common terminal (40) and the antenna terminal (81). The plurality of band pass filters (12A to 12D, 22A to 24D) are mounted on the mounting board (9) and are connected to the plurality of selection terminals (41 to 43). The plurality of inductors (71 to 73) are connected to the plurality of band pass filters (12A to 12D, 22A to 24D) between the plurality of band pass filters and the switch (4; 4A, 4B). The plurality of band pass filters (12A to 12D, 22A to 24D) have a first band pass filter (22A) and a second band pass filter (22B). The first band pass filter (22A) is connected to the first selection terminal (41) and has a pass band, which is a first frequency band. The second band pass filter (22B) is connected to the second selection terminal (42) and has a pass band, which is a second frequency band, which is higher than the first frequency band. The attenuation filter (3; 3A) is a low pass filter or a notch filter including at least one reactive element out of an inductive element (for example, the inductor 32) and a capacitive element (for example, the capacitor 35). In the radio frequency module (1; 1A), in a case where the mounting board (9) is viewed in a plan view, the reactive element described above is adjacent to at least one inductor (for example, the inductor 72) out of the plurality of inductors (71 to 73).

According to this mode, the degradation of the filter characteristic of a band pass filter corresponding to relatively high frequencies (for example, the second reception filter 22B) due to a harmonic wave component of a signal that passes through a band pass filter corresponding to relatively low frequencies (for example, the first reception filter 22A) can be suppressed.

In the radio frequency module (1; 1A) according to a fourth mode, in any one of the first to third modes, the attenuation filter (3; 3A) attenuates a harmonic wave component of a reception signal received through the antenna terminal (81).

According to this mode, the harmonic wave component of the reception signal can be attenuated by (3; 3A).

A communication device (300; 300A) according to a fifth mode includes the radio frequency module (1; 1A) according to any one of the first to fourth modes and a signal processing circuit (301). The signal processing circuit (301) processes a reception signal received through the antenna terminal (81).

According to this mode, the degradation of the filter characteristic of a band pass filter corresponding to relatively high frequencies (for example, the second reception filter 22B) due to a harmonic wave component of a signal that passes through a band pass filter corresponding to relatively low frequencies (for example, the first reception filter 22A) can be suppressed.

1, 1A radio frequency module
2 filter unit
2A first filter unit
2B second filter unit
2C third filter unit
3, 3A attenuation filter (low pass filter, notch filter)
4, 4A, 4B first switch (switch)
5, 5A second switch
6, 6A third switch
7, 7A matching circuit
9 mounting board
10 chip
11 power amplifier
12A first transmission filter (band pass filter)
12B second transmission filter (band pass filter)
12C third transmission filter (band pass filter)
12D fourth transmission filter (band pass filter)
13 output matching circuit
14 multiplexer
21 low noise amplifier
22A first reception filter (first band pass filter)
22B second reception filter (second band pass filter)
22C third reception filter (band pass filter)
22D fourth reception filter (band pass filter)
23 input matching circuit
24 connection portion
30 connection portion
31 to 33, 31A to 33A inductor (inductive element, reactive element)
34 to 36, 34A to 36A capacitor (capacitive element, reactive element)
37, 37A input terminal
38, 38A output terminal
40 common terminal
41 to 44 selection terminal
50 common terminal
51 to 54 selection terminal
60 common terminal
61 to 64 selection terminal
70 connection portion
71 to 74 inductor
81 antenna terminal
82 signal input terminal 83 signal output terminal
91 first main surface
92 second main surface
111 input terminal
112 output terminal
211 input terminal
212 output terminal
300, 300A communication device
301 signal processing circuit
310 antenna
391, 392 parallel circuit
391A to 393A, 393 series circuit
HA1, HA2 harmonic wave
P1, P2 path
PB1 to PB5 pass band
N1 to N4 node

The invention claimed is:

1. A radio frequency module comprising:
a mounting board;
a switch mounted on the mounting board and having a common terminal connected to an antenna terminal and a plurality of selection terminals configured to be connected to the common terminal, the switch being configured to simultaneously connect the common terminal to at least a first selection terminal and a second selection terminal out of the plurality of selection terminals;
an attenuation filter mounted on the mounting board and connected between the common terminal and the antenna terminal; and
a plurality of band pass filters mounted on the mounting board and connected to the plurality of selection terminals,
wherein:
the plurality of band pass filters comprises:
a first band pass filter connected to the first selection terminal and having a pass band in a first frequency band and
a second band pass filter connected to the second selection terminal and having a pass band in a second frequency band, which is higher than the first frequency band,
the attenuation filter is a low pass filter or a notch filter including at least one reactive element out of an inductive element and a capacitive element, and
the reactive element is adjacent to at least one band pass filter out of the plurality of band pass filters when the mounting board is viewed in a plan view.

2. The radio frequency module according to claim 1, wherein
the attenuation filter comprises one chip including the reactive element, and
the attenuation filter is adjacent to the at least one band pass filter when the mounting board is viewed in a plan view.

3. The radio frequency module according to claim 2, wherein
the attenuation filter attenuates a harmonic wave component of a reception signal received through the antenna terminal.

4. A communication device comprising:
the radio frequency module according to claim 2; and
a signal processing circuit that processes a reception signal received through the antenna terminal.

5. The radio frequency module according to claim 1, wherein
the attenuation filter attenuates a harmonic wave component of a reception signal received through the antenna terminal.

6. The radio frequency module according to claim 1, wherein the plurality of band pass filters further comprises a first transmission filter, a second transmission filter, a first reception filter, and a second reception filter.

7. The radio frequency module according to claim 6, wherein the first band pass filter is the first reception filter and the second band pass filter is the second reception filter.

8. The radio frequency module according to claim 6, wherein the first transmission filter and the first reception filter are integrated on one chip.

9. The radio frequency module according to claim 6, wherein the second transmission filter and the second reception filter are integrated on one chip.

10. The radio frequency module according to claim 6, wherein the first selection terminal is connected to a connection point connecting an output terminal of the first transmission filter to an input terminal of the first reception filter.

11. The radio frequency module according to claim 6, wherein the second selection terminal is connected to a connection point connecting an output terminal of the second transmission filter to an input terminal of the second reception filter.

12. The radio frequency module according to claim 6, further comprising a power amplifier, a low noise amplifier, an output matching circuit, and an input matching circuit.

13. The radio frequency module according to claim 12, further comprising a second switch having a common terminal and a plurality of selection terminals.

14. The radio frequency module according to claim 13, wherein the common terminal is connected to an output terminal of the power amplifier with the output matching circuit interposed therebetween.

15. The radio frequency module according to claim 13, wherein a first selection terminal of the plurality of selection terminals is connected to an input terminal of the first transmission filter and a second selection terminal of the plurality of selection terminals is connected to an input terminal of the second transmission filter.

16. A communication device comprising:
the radio frequency module according to claim 1; and
a signal processing circuit that processes a reception signal received through the antenna terminal.

17. The communication device according to claim 16, wherein the signal processing circuit controls the switch.

18. A radio frequency module comprising:
a mounting board;
a switch mounted on the mounting board and having a common terminal connected to an antenna terminal and a plurality of selection terminals configured to be connected to the common terminal, the switch being configured to simultaneously connect the common terminal to at least a first selection terminal and a second selection terminal out of the plurality of selection terminals;
an attenuation filter mounted on the mounting board and connected between the common terminal and the antenna terminal;
a plurality of band pass filters mounted on the mounting board and connected to the plurality of selection terminals; and
a plurality of inductors connected to the plurality of band pass filters between the plurality of band pass filters and the switch, wherein:
the plurality of band pass filters comprises:
a first band pass filter connected to the first selection terminal and having a pass band in a first frequency band and
a second band pass filter connected to the second selection terminal and having a pass band in a second frequency band, which is higher than the first frequency band,
the attenuation filter is a low pass filter or a notch filter including at least one reactive element out of an inductive element and a capacitive element, and
the reactive element is adjacent to at least one inductor out of the plurality of inductors when the mounting board is viewed in a plan view.

19. The radio frequency module according to claim 18, wherein
the attenuation filter attenuates a harmonic wave component of a reception signal received through the antenna terminal.

20. A communication device comprising:
the radio frequency module according to claim 18; and
a signal processing circuit that processes a reception signal received through the antenna terminal.

\* \* \* \* \*